Figure 3:
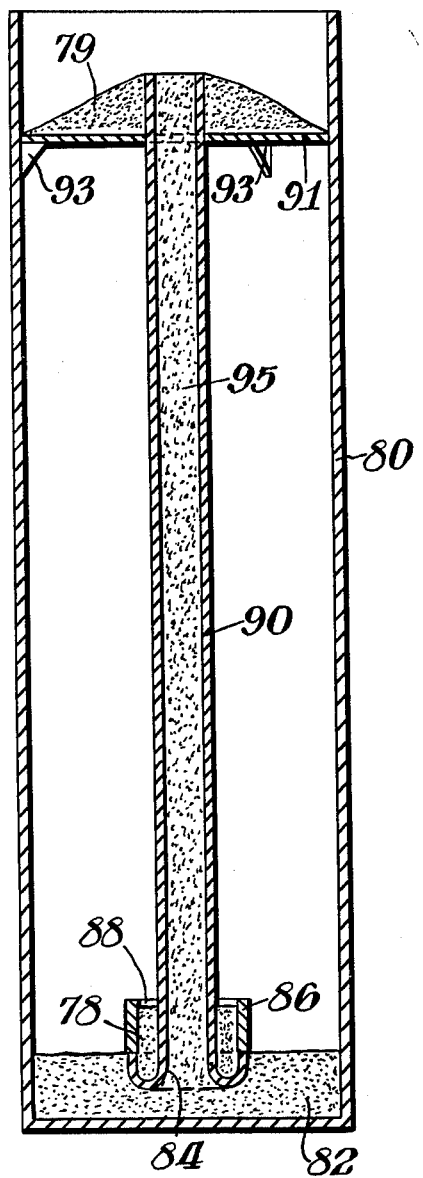

United States Patent [19]

Baldi

[11] Patent Number: 4,467,016
[45] Date of Patent: Aug. 21, 1984

[54] ALUMINIZED CHROMIZED STEEL

[75] Inventor: Alfonso L. Baldi, Wynnewood, Pa.

[73] Assignee: Alloy Surfaces Company, Inc., Wilmington, Del.

[21] Appl. No.: 398,830

[22] Filed: Jul. 16, 1982

Related U.S. Application Data

[63] Continuation-in-part of Ser. No. 359,212, Mar. 18, 1982, , and a continuation-in-part of Ser. No. 238,500, Feb. 6, 1981, Pat. No. 4,350,719, and a continuation-in-part of Ser. No. 851,504, Nov. 14, 1977.

[51] Int. Cl.³ ............................................. B21C 37/00
[52] U.S. Cl. ................................. 428/595; 138/143; 138/146; 138/DIG. 6; 427/237; 427/239; 427/252; 427/253; 427/319; 427/320; 427/405; 427/255.7; 428/36; 428/651; 428/667
[58] Field of Search ............... 427/237, 239, 252, 253, 427/259, 282, 405, 319, 320, 255.7, 328; 428/667, 651, 595, 36; 138/143, 146, DIG. 6

[56] References Cited

U.S. PATENT DOCUMENTS

| | | | |
|---|---|---|---|
| 3,694,255 | 9/1972 | Brill-Edwards | 427/253 |
| 3,764,371 | 10/1973 | Baldi | 427/253 |
| 3,801,357 | 4/1974 | Baldi | 427/282 |
| 3,936,539 | 2/1976 | Baldi | 427/253 |
| 4,181,758 | 1/1980 | Elam | 427/253 |
| 4,208,453 | 6/1980 | Baldi | 427/239 |
| 4,350,719 | 9/1982 | Baldi | 427/405 |

*Primary Examiner*—Sadie L. Childs
*Attorney, Agent, or Firm*—Connolly and Hutz

[57] ABSTRACT

Low alloy steel tubing is decarburized, chromized and then aluminized with or without masking at the sites at which the tubing is to be welded in place, to greatly increase resistance of the tubing to high temperature oxidation and sulfidation. Low surface aluminum content after aluminizing makes it easier to weld at that surface.

6 Claims, 3 Drawing Figures

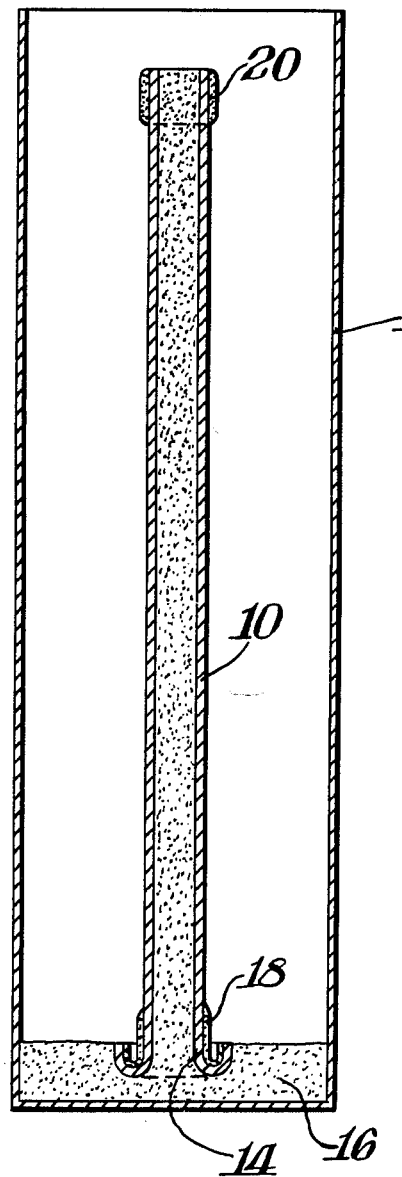
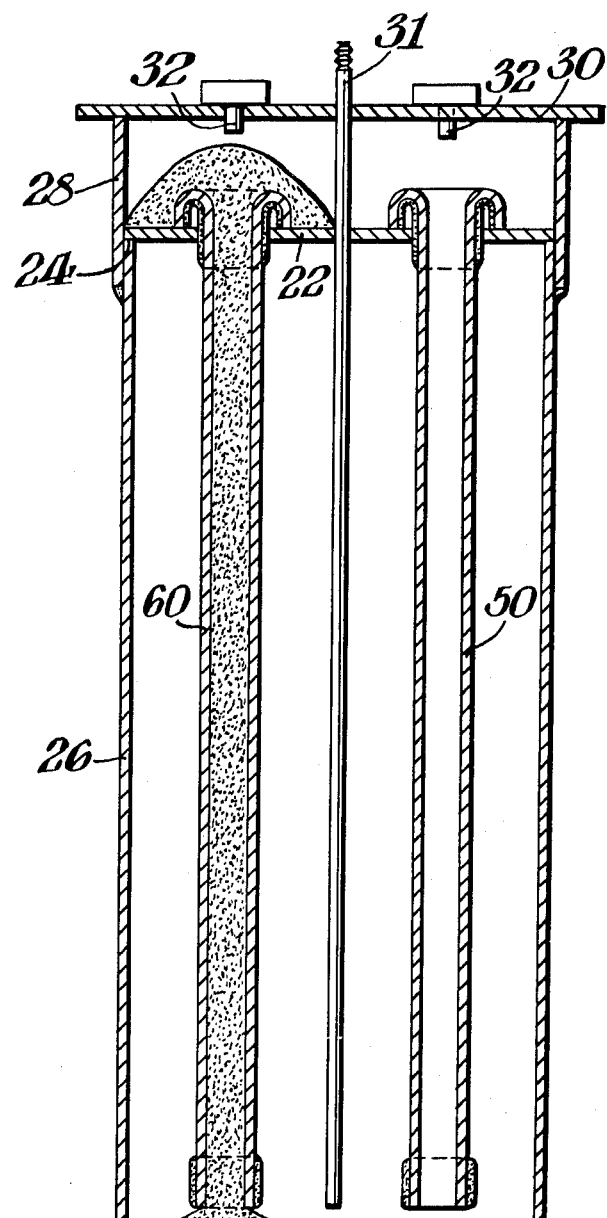

ALUMINIZED CHROMIZED STEEL

This application is a continuation-in-part of U.S. patent application Ser. No. 359,212 filed Mar. 18, 1982, International Patent Application US82/00220 filed Feb. 23, 1982, and also of U.S. patent application Ser. No. 238,500 filed Feb. 6, 1981. (U.S. Pat. No. 4,350,719 granted Sept. 21, 1982)as well as of U.S. patent application Ser. No. 851,504 filed Nov. 14, 1977. The International application has entered the National stage as Ser. No. 416,353 filed June 2, 1982.

The present invention relates to the coating of metals to increase their resistance to corrosion and other chemical attacks.

Among the objects of the present invention is the provision of novel coating techniques and compositions for use therewith, as well a novel coated products, all suitable for commercial operations.

Additional objects of the present invention include techniques for confining protective diffusion coatings to desired locations on workpieces.

The foregoing as well as further objects of the present invention will be more fully understood from the following description of several of its exemplifications, reference being made to the accompanying drawings wherein FIGS. 1, 2 and 3 show three different diffusion coating techniques typifying the present invention.

For increasing the resistance of steels, even low alloy steels, to attack by hot sulfur-containing materials, chromizing is very effective when it penetrates more than about 3 mils and is followed by an even deeper aluminizing. Less penetrating treatment of superalloys is disclosed in U.S. Pat. Nos. 3,764,371, 3,694,255 and 4,041,196, and a similar treatment is disclosed in U.S. Pat. No. 3,656,919, but the present invention applies such a sequence to low alloy steels such as those called chromium steels. These chromium steels of the present invention contain from about 0.6 to about 1.5% chromium, and their carbon contents can range from about 0.15% to about 1.10%. This carbon content is not in stabilized form and is accordingly sufficient to seriously limit the case depth obtained by chromizing, as well as correspondingly limit the maximum resistance obtainable against hot sulfidation. Unprotected low alloy steels used in petroleum refinery operations for example, are generally very susceptible to hot sulfidation, so that a high degree of protection is called for.

According to the present invention low alloy steels such as the above-noted chromium steels have their surfaces first decarburized to a depth of at least about 3 mils, then chromized to provide a case at least about 2 mils thick, and then aluminized to a depth of at least about 6 mils. One preferred decarburizing is to a depth of 4 to 6 mils, along with chromizing to provide a case thickness of about 3 to 4 mils, and aluminizing to a final diffusion case of about 10 to about 14 mils. Another preferred decarburizing is to a depth of 8 to 10 mils, followed by chromizing to a case depth of 11 to 12 mils, and aluminizing to a depth of about 20 mils.

The respective treatments can be applied individually in spaced operations, or they can be combined as successive stages of a single heat sequence. Each stage can be a conventional one such as:

EXAMPLE I

1. A number of chromium steel tubes used for a heat exchanger in oxidative cracking of sulfur-containing petroleum residues were cleaned, and then placed in a retort through which hydrogen having a dew point of 40° to 60° F. is passed, while the retort is heated to 1800°-1850° F. for three hours. Before the treatment, the tubes had 0.7 to 0.8% chromium and 0.18% carbon, their side walls were about ¼ inch thick, their internal diameter about 2 inches, and one end of each tube was flared out and mushroomed back. After the three hour treatment, heating was discontinued and the tubes permitted to cool to room temperature. They showed a surface decarburization about 6 mils deep.

2. The decarburized tubes were then loaded in a vertical retort, the floor of which had a four-inch thick layer of powdered chromizing pack into which the flared ends were embedded. The interior of the tubes were filled with the same chromizing pack, which was a pre-fired 1:4 by weight mixture of chromium powder and the fluent tabular $Al_2O_3$ described in U.S. Pat. No. 4,208,453, with ½% $NH_4Cl$ based on the weight of the 1:4 mixture. The retort was then covered and fired as in U.S. Pat. No. 3,801,357 to bring its contents to 1950°-1975° F. for ten hours. Upon subsequent cooldown the tubes showed a chromized case 3 to 4 mils thick, the outer quarter having a chromium-carbide-rich phase with the remainder having a columnar ferrite structure.

3. The chromized tubes were returned to the vertical retort, which this time contained a layer of aluminizing powder pack, and the tube interiors were filled with the same aluminizing pack—a pre-fired mixture of 45 weight % chromium powder, 10 weight % aluminum powder and 45 weight % powdered alumina, activated with ½% $NH_4Cl$. The aluminizing heat was at 1950°-1975° F. for ten hours and left a consolidated diffusion case 12 to 14 mils thick. The outer surface of this case contained about 21% aluminum and about 21% chromium, whereas the middle of the case contained about 12.5% aluminum and about 13.7% chromium. These tubes showed a very high resistance against hot sulfidation, and in one instance a tube was attacked so severely that the steel base has completely eaten through leaving an almost unscathed diffusion case as a shell.

A typical tube of the foregoing type is illustrated at 10 in FIG. 1, where it is shown held in a retort 12 with its reversely flared end 14 imbedded in one of the diffusion coating packs. Where the tube has an external surface portion that is not to receive a diffusion coating, as for instance because that portion is closely fitted or welded into a mounting sheet or the like, that surface portion can be masked. Then a slurry type powdered alumina masking coating can be applied as illustrated at 18 and 20. Alternatively a powder type masking mixture can be poured into the cup-shaped portion of flare 14, and if desired such powder can be held in place with the help of a steel ring fitted around the powder and resting on the upturned lip of the flare.

The decarburizing can be conducted in any convenient way, although it is preferred to use hydrogen having a dew point at least as high as 0° F. The decarburizing temperature can vary in the manner shown in the prior art, and effective decarburizing produces a weight loss of from about 0.3 to about 0.6 milligrams per square centimeter of treated surface. This can be checked by including in the retort a spare coupon of the metal being treated and withdrawing the coupon to check its weight. If desired the decarburizing can be more vigorous and produce a weight loss of as much as 1 milligram per square centimeter of treated surface.

The diffusion chromizing and aluminizing can also be varied as disclosed in the prior art. A good chromium pick-up is at least 15 and better still over 25 milligrams per square centimeter of surface, and a good aluminum pick-up is at least 25 and preferably over 40 milligrams per square centimeter. Another good combination has a pick-up of over 30 milligrams of chromium per square centimeter and a pick-up of about 20 to about 40 milligrams aluminum per square centimeter.

Although the aluminum pick-up appears large when measured in milligrams per square centimeter, the aluminum penetration is so deep and agressive that the aluminum concentration at the surface can be as little as about 5% by weight. The aluminizing also causes the chromium diffusion to deepen, but the final concentration of chromium at the surface is generally at least about 15%.

The separate treatments can be partially or completely run together in a single retort without removing the tubes from the retort between treatment steps. Some combinations of decarburizing with chromizing are mentioned in U.S. Pat. No. 3,449,159, but the decarburizing of the present invention is a very substantial one in which the decarburized zone is not only deep but shows a carbon content well below 0.05%.

Gas chromizing as in U.S. Pat. Nos. 3,449,159 and 3,222,122 is particularly desirable when consolidating the chromizing with both the decarburizing and the aluminizing. The only pack in contact with the tubes in such a consolidation is the aluminizing pack, inasmuch as gas aluminizing is not sufficiently effective.

FIG. 2 illustrates a retorting arrangement for consolidated treatments. Two tubes 50 and 60 are here shown lowered through a perforated removable shelf 22 resting on the upper edge of a cylindrical retort shell which has welded around its upper margin a relatively short retort extension 28. The top of the retort is loosely covered with a plate 30 fitted with a vent pipe 31 and a set of nozzles 32 downwardly directed over each tube-receiving perforation in shelf 22. For decarburizing, the tubes are mounted as at 50 and wet hydrogen introduced through nozzles 32 so as to pass downwardly through and decarburize the interiors of the tubes. Some of the introduced hydrogen also spills over the flared tube ends and decarburizes them as well.

When the decarburizing is completed the flow of wet hydrogen is stopped, and gas chromizing streams are introduced through nozzles 32. No other change except for a shift to the chromizing temperature is needed, so that the retort can be kept at operating temperatures throughout.

The next shift is to aluminizing and for this the cover 30 or the nozzles 32 are removed so that a powder aluminizing pack can be poured into the tubes. By keeping the lower ends of the tubes within an inch or so of the retort floor a low fluency pack can be poured in place without building up very much on that floor. On the other hand a more fluent pack can be used with more of the pack spreading out on the floor as well as over the flared tube ends.

It will generally be desirable to cool the retort and its contents somewhat before introducing the aluminizing pack. To this end the burners around the retort can be shut down and a rapid flow of argon introduced through vent 31. Because no thermal insulation is present in the retort, aside from the masking layers, the tubes are fairly rapidly cooled in this way. After sufficient argon flow to flush and fill the retort with that gas, the retort cover or nozzles 32 can generally be removed even though the tubes are still at about 900° F., especially if the rapid argon flow is maintained as a protective shield around the tubes and the openings at the retort top kept very small. The aluminizing pack can then be promptly poured through such openings into the tubes to further cool them both by contact as well as by volatilization of the activator contained in the pack. To avoid premature depletion of the activator when so added, the activator content of the pack can be somewhat elevated, such as 1½% by weight, instead of the usual ¼ to ½% by weight.

As soon as the pack addition is completed the retort-heating burners can be re-started to carry the retort contents to the desired aluminizing temperature. Where the aluminizing pack is a chromium-free pack, the aluminizing can be very effectively conducted at temperatures as low as 1400° F. or even lower, without much reduction in coating rate. Aluminizing at temperatures below about 1200° F. is best effected with an aluminum halide activator such as $AlCl_3$.

The cooling applied before the aluminizing can be to very low temperatures if desired. Thus cooling to about 630° F. will enable the introduction of an $NH_4Cl$-activated pack without significant loss of $NH_4Cl$ by volatilization, and cooling to about 350° F. will similarly minimize loss of $AlCl_3$ from an $AlCl_3$-activated pack. Cooling to 150° F. will enable withdrawal of the chromized tubes from the retort, as for example if they are to be closely inspected to check on the chromized case or to replace or apply the masking. Cut off short pieces of tubing can be placed on shelf 22 to act as test members that can be removed when desired to check on the treatment without removing the tubes themselves.

The consolidating of the aluminizing with the previous treatments requires much more than the mere consolidation of the decarburizing with the chromizing. This simpler consolidation can also be effected with the use of a chromizing pack rather than a gas phase chromizing, so that such pack is replaced by an aluminizing pack for the aluminizing step.

The exteriors of the tubes subjected to the three-step treatment of decarburizing, chromizing and aluminizing, also show the effects of such treatment steps, although these effects are minimized at the masked areas. The decarburized exterior surfaces become chromized to some degree and this strengthens those surfaces.

The hydrogen used for decarburizing, and/or the gas chromizing gases, can be introduced at the bottom of the retort instead of at the top, in which cases tube 31 can be the gas inlet and one or more of the nozzles 32 can act as a vent.

Other chromium steels and other low alloy steels can be treated in place of the foregoing tubes, to give similarly protected products. Plain steels having about 0.1% or less of carbon are generally not strong enough or sufficiently resistant for use in hot environments, but they too can be similarly chromized and aluminized to yield products showing very little corrosion in hot sulfidation environments, and do not need a preliminary decarburizing. Steels that have their carbon contents stabilized as noted in U.S. Pat. No. 3,449,159, likewise need no decarburizing.

A high degree of decarburizing is desirable for unstabilized carbon contents, inasmuch as this enables very heavy diffusion chromizing. The following is an exemplification.

EXAMPLE II

The procedure for Example I is followed, with the following changes:

A. The decarburizing is conducted at 1825° to 1875° F. for six hours with wet hydrogen having a dew point at least as high as 20° F. to yield a decarburized surface 8 to 10 mils deep.

B. The chromizing is conducted with a non-prefired pack of 20% chromium and 80% non-fluent alumina, activated as in Example I. The chromizing is at 2050° to 2100° F. for 10 hours, leaving a chromized case 11 to 12 mils deep essentially all columnar ferrite and with little or not distinguishable chromium-carbide-rich phase. It is noted that the chromizing causes a little increase in the decarburizing depth, and is as deep as the resulting decarburizing. The surface chromium content is about 50 milligrams per square centimeter. The chromizing also causes significant loss of carbon from the body of the substrate.

C. The aluminizing is conducted with a non-prefired pack of, by weight:

| 5.4% | aluminum |
|---|---|
| 46.4% | chromium | balance alumina activated as in Example I. The aluminizing temperature is 2050° to 2100° F. for 10 hours. The resulting case is about 20 mils deep and the aluminum concentration at the surface is about 12%.

Modifying Example II by reducing the aluminum content of the aluminizing pack to 2.5% and its chromium to 43.5% yields a case depth of about 18 mils and a surface aluminum content of about 6%.

The products of Example II show a somewhat better resistance than that of Example I, to oxidative and sulfide attack at 1500° F.

Without the final aluminizing the chromized tubes also show very good resistance to oxidative and sulfidative attack, and the greater the chromium in the diffusion case the higher the resistance. However even the resistance of a chromized tube having a chromized skin with 30 to 40% chromium content is improved by a subsequent aluminizing. Where expenses are to be minimized the aluminizing can be omitted for such highly chromized cases.

The masking compositions used in the process of the present invention are preferably free of metallic aluminum or metallic aluminides. Alumina alone is an effective maskant for the techniques of the examples, inasmuch as the masking is not in a location contacted by a diffusion coating pack.

On ordinary irons and steels as well as low alloy steels, a localized layer of powdered iron appropriately diluted with inert diluent such as alumina, can be applied to reduce or prevent diffusion coating under the layer. This layer can be covered by a sheath-forming layer, but such covering is not needed where the workpieces are not roughly handled during treatment.

Powdered iron containing chromium can also be used, suitably diluted, particularly to mask chromium steels against aluminizing. Nickel can also be present in such a masking powder, even though it tends to diffuse into the masked surface, because it does such a good job of tying up aluminum. It is generally more important to keep aluminum from diffusing into the surfaces to be masked, inasmuch as the aluminizing is so aggressive and frequently leaves a surface difficult to weld. It takes at least about 20 weight % diluent powder of non-metallic masking ingredients to keep metallic masking compositions from sintering to the workpiece. For very high diffusion temperatures, the diluent powder is preferably at least 30 weight %.

Where the presence of a little aluminum can be tolerated, the masking compositions of U.S. Pat. No. 4,208,453 can be used.

A particularly effective masking technique is shown in the following example.

EXAMPLE III

The tubes of Example I are given the decarburizing treatment of that Example, after which they are subjected to chromizing as in Example II but with the chromizing pack containing 30% chromium by weight, and the time at chromizing temperature extended to 15 hours. The internal tube surfaces then show a chromized case about 14 mils deep with its surface having a chromium content of at least about 30%. In some instances a very thin skin, about 0.5 mil thick, of very concentrated chromium carbides such a $Cr_{23}C_6$ forms on the chromized surfaces, and such skin can have a chromium content of about 70%.

The chromized tubes are given a masked aluminizing using a powdered aluminizing pack composed of

| 450 | pounds chromium |
|---|---|
| 30 | pounds aluminum |
| 520 | pounds aluminum oxide |
| 10 | pounds NH$_4$Cl |

That pack is broken in by pre-firing at 1975°–2000° F. for 12 hours, after which the pack is cooled and fresh NH$_4$Cl is added. Any chromium carbide skin present does not interfere with the aluminizing, and in fact such carbide is substantially completely reduced by the aluminizing.

As shown in FIG. 3, a tall retort 80 has a relatively shallow layer 82 of broken-in aluminizing pack poured over its floor. A tube 90 is then lowered into the retort with its mushroomed end 84 down. Before lowering, a ring 86 of 1010 steel is placed over the mushroomed end to form a chamber 88 that will retain powder. In this chamber is placed a broken-in powdered masking mixture 78 having the following composition

| 1806 | grams chromium |
|---|---|
| 995 | grams iron |
| 1204 | grams nickel |
| 10000 | grams Al$_2$O$_3$ |

The breaking in of the masking composition is effected by first adding to it 200 grams of NH$_4$Cl, mixing the combination well, and then firing it at 1750° F. for 10 hours. After the firing the NH$_4$Cl is all gone and no make-up of this ingredient is made.

The tube, carrying ring 86 and masking mixture 78, is then lowered into place, as shown in FIG. 3. A retaining plate 91 is then placed around the upper end of tube 90, so that it is held on lugs 93 welded to the interior of the retort. Additional broken-in masking mixture 79 is then poured on plate 91 so as to cover the outer face of tube 90, at its upper end. Tube 90 can now be filled with the aluminizing mixture 95, and the aluminizing started.

Very effective aluminizing is accomplished by a 15-hour hold at 1850° F., and the aluminized surface of the resulting tube has an aluminum content of about 5.5%.

The masking mixture on plate 91 can be removed with a vacuum cleaner when the retort is ready to be unloaded, to minimize the dropping of some of that masking mixture onto aluminizing layer 82. It is generally a simple matter to withdraw tube 90 without spilling any of the masking mixture 78. If desired however either or both of these masking mixtures can be locked in place with an overlying sheath-forming layer as described in U.S. Pat. No. 4,208,453 to further assure that no masking mixture is spilled onto the aluminizing mixture during unloading.

Also masking mixture 79 can be confined between the outer surface of the tube 90 and the inner surface of a surrounding metal ring such as 86.

The masking of Example III is very effective in holding to about zero the aluminum content of the masked outer surfaces of tube 90. It also does not significantly alter the composition of that outer surface, a difficulty frequently experienced with simpler masking compositions which have the effect of causing metal to diffuse out from the tube surface into the masking pack.

For these results, the metal ingredients of the masking pack can vary as follows, by weight:

chromium—between about 5 and about 15%
iron—between about 4 and about 10%
nickel—between about 4 and about 12%

When the aluminizing leaves the outer tube surface with less than about 10%, preferably less than about 7% aluminum, welding of the tube into a ferrous tube sheet as by oxy-acetylene torch and standard low-nickel welding rod, is no great problem although it takes a little longer than the welding of a non-aluminized tube. However the savings in not requiring the masking more than makes up for the extra welding time. A surface aluminum content below about 5% has even less effect on weldability, and can be provided as by using the aluminizing mixture of Example III at a temperature no higher than about 1800° F. for a time no longer than about 12 hours. Packs containing less or no chromium can also be used, but for shorter times and at still lower temperatures.

It is particularly desired to have the interior surface of the tubing with a chromium content of from about 30 to about 40%, and an aluminum content from about 4 to about 10%. These ranges provide exceptionally good resistance to oxidation and sulfidation, although chromium contents as low as 25%, and aluminum contents as high as 15% can be used.

When a carbon-containing binder is used to hold a masking mixture in place, as described in U.S. Pat. No. 4,208,453, it can sometimes leave a little extra carbon on the substrate surface covered by the masking mixture. While such carbon deposition is not significant in substrates that contain a substantial carbon content, such deposition can be reduced or completely eliminated for substrates that contain only a small carbon content or none at all. Thus nitrocellulose and bentonite are effective binders that leave behind little or no carbon. Nitrocellulose can thus be dissolved in nitrobenzene or nitromethane, and bentonite can be mixed with water, to each form binders to which the masking powders are added to make a masking slurry or mud.

The minimizing of carbon residue is particularly desirable when masking the so-called single crystal superalloy vanes and blades for the hot section of a jet engine.

These single crystal products contain essentially no carbon, and are significantly weakened when they pick up a little carbon from a masking mixture applied in the course of a diffusion aluminizing, for example. The foregoing binders that do not deposit any significant carbon are accordingly particularly suited to provide slurry coatings such as shown at 20, for masking such diffusion aluminizing or masking diffusion coatings with other metals.

Where a masking mixture does not have to hold itself in place, as for example where a slurry-type masking layer is coated on a portion of a substrate that is embedded in a diffusion coating pack, the binder in such masking layer can be one like paraffin wax that is cleanly vaporized away at temperatures too low to cause carbonizing. Such low-temperature removal leaves the masking layer too friable to properly adhere to a workpiece surface without the backing of the diffusion coating pack.

The foregoing non-carbonizing binders can be used to bind depletion-reducing coatings as well as masking coatings. Suitable depletion-reducing ingredients are disclosed in U.S. Pat. No. 4,208,453.

For best results the single crystal superalloy workpieces are masked with binder-free masking mixtures, as in FIG. 3. Also for such purposes the nickel and any other metal in such masking mixtures should be free of detectable carbon. In addition the breaking in of such a masking mixture should not expose it to significant quantities of carbon. Thus the retort used for the break-in is preferably a carbon-free or low carbon content metal.

Masking mixtures that rely on powdered nickel have strong surface-depletion tendencies, and substituting powdered iron for two-thirds the powdered nickel, by weight, sharply reduces those tendencies without significantly impairing the masking function. Such substitution for at least half the nickel is desirable. Thus a suitable low-depleting sheath-forming masking mixture is:

1000 grams powdered nickel
2000 grams powdered iron
2400 grams powdered alumina slurried in a 5% solution of paraffin wax in mineral spirits.

Pre-alloying the nickel with the iron, as by pre-firing the powdered solids with ½% by weight NH$_4$Cl in a hydrogen-bathed retort at 1800° F. for eight hours, further reduces the surface-depletion tendencies.

These nickel-iron mixtures or alloys can be used as a top masking layer over an inert lower layer of alumina at least 20 mils thick, for masking a chromizing or aluminizing that is conducted at temperatures up to 2100° F. However for diffusion temperatures below about 1200° F., no lower layer is needed. Without a lower layer it is preferred that the powdered nickel-iron mixture or alloy be diluted with sufficient alumina, magnesia or other inert refractory powder to hold the nickel-iron content to between about 10 and about 50% by weight. When used with a lower layer, the nickel-iron masking layer preferably has a nickel-iron content of at least 40% by weight, and need contain no diluent.

The nickel-iron mixtures tend to cause a little diffusion of iron and nickel into a substrate on which these mixtures are applied. This effect has no real significance where the substrate surface already contains at least about 25% iron. For substrate surfaces containing less iron it is preferred to keep the iron content of the sheath-forming masking below 20% by weight, and even down to 10% by weight for substrate surfaces containing less than 1% iron.

Where the aluminized skin of a ferrous metal pipe or other workpiece, has an aluminum content of about 20 atom percent or more, that aluminum content can be decreased by leaching the aluminized surface with hot concentrated aqueous KOH or NaOH. This leaching treatment can be similar to that described in application Ser. No. 302,979 filed Sept. 17, 1981 and subsequently refiled. Such treatment is more severe than the relatively mild leaching described in U.S. Pat. No. 3,764,371, particularly where the aluminized workpiece is a stainless steel. Type 304 stainless steel aluminized to an aluminum pick-up of 0.5 milligram per square centimeter can thus have its surface aluminum content reduced to simplify welding.

The aluminized and leached surfaces tend to be catalytic, particularly where the leaching is sufficiently vigorous to cause hydrogen generation, evidenced by bubbling, for at least about fifteen minutes. However a catalytic stainless steel surface prepared this way will show no pyrophoric tendency.

Obviously many modifications and variations of the present invention are possible in light of the above teachings. It is therefore to be understood that within the scope of the appended claims the invention may be practiced otherwise than as specifically described.

What is claimed:

1. The process of protecting against hot sulfidation a low alloy steel tube that is to be welded in place, which process is characterized by the steps of subjecting the tube to a heavy diffusion chromizing, followed by a diffusion aluminizing in which the aluminizing is arranged to leave the welding sites with a surface aluminum content less than about 10% without masking.

2. The combination of claim 1 in which the chromizing is sufficiently heavy to leave the aluminized surface with a chromium content of at least about 25%.

3. The combination of claim 1 in which the surface aluminum content is less than 5%.

4. The combination of claim 1 in which the low alloy steel is a chromium steel.

5. The combination of claim 4 in which the chromium steel has its surface decarburized before it is subjected to the diffusion chromizing.

6. The product produced by the process of claim 1.

* * * * *